US012660516B2

(12) United States Patent
Jawaharram et al.

(10) Patent No.: US 12,660,516 B2
(45) Date of Patent: Jun. 16, 2026

(54) STRUCTURE AND METHOD OF DEPOSITING MEMORY CELL ELECTRODE MATERIALS WITH LOW INTRINSIC ROUGHNESS

(71) Applicant: Intel Corporation, Santa Clara, CA (US)

(72) Inventors: Gowtham Sriram Jawaharram, Rio Ranch, NM (US); Cyrus M. Fox, Rio Rancho, NM (US); Jose L. Cruz-Campa, Albuquerque, NM (US); Shafaat Ahmed, Albuquerque, NM (US); Qiaoer Zhou, Albuquerque, NM (US); Duo Li, Rio Rancho, NM (US); Hong Li, Albuquerque, NM (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 17/735,113

(22) Filed: May 2, 2022

(65) Prior Publication Data

US 2023/0354723 A1    Nov. 2, 2023

(51) Int. Cl.
*H10N 70/00* (2023.01)
*H10B 63/00* (2023.01)
*H10N 70/20* (2023.01)

(52) U.S. Cl.
CPC .......... *H10N 70/841* (2023.02); *H10B 63/24* (2023.02); *H10B 63/84* (2023.02); *H10N 70/063* (2023.02); *H10N 70/231* (2023.02)

(58) Field of Classification Search
CPC .. H10N 70/841; H10N 70/063; H10N 70/231; H10B 63/24; H10B 63/84
See application file for complete search history.

(56) References Cited

U.S. PATENT DOCUMENTS

2016/0064665 A1* 3/2016 Fumagalli ............ H10N 70/861
257/4

* cited by examiner

*Primary Examiner* — Samuel A Gebremariam
(74) *Attorney, Agent, or Firm* — Alliance IP, LLC

(57) ABSTRACT

In one embodiment, a crosspoint memory device is manufactured by forming a material stack and patterning the material stack to form a plurality of memory cells of the cross point memory device. Forming the material stack includes depositing a select device (SD) region material comprising chalcogenide, depositing a layer comprising carbon on the SD region material at a temperature below 40° C., depositing an ohmic contact layer on the layer comprising carbon, and depositing a phase change material (PM) region material comprising chalcogenide on the ohmic contact layer.

25 Claims, 8 Drawing Sheets

500

215

217

208

209

207

520

207

522

600

| Electrode 620 |
| --- |
| Highly-resistive layer 618 |
| Ohmic contact layer 616 |
| PM region 614 |
| Ohmic contact layer 612 |
| Highly-resistive layer 610 |
| SD region 608 |
| Highly-resistive layer 606 |
| Ohmic contact layer 604 |
| Electrode 602 |

700

702 — Deposit metal electrode

704 — Deposit ohmic contact layer

706 — Deposit highly-resistive material layer

708 — Deposit SD region material

710 — Deposit highly-resistive material layer

712 — Anneal material stack

714 — Deposit ohmic contact layer

716 — Deposit PM region material

718 — Deposit ohmic contact layer

720 — Deposit highly-resistive material layer

722 — Pattern memory cell stacks

STRUCTURE AND METHOD OF DEPOSITING MEMORY CELL ELECTRODE MATERIALS WITH LOW INTRINSIC ROUGHNESS

FIELD

The present disclosure relates in general to the field of computer memory structures, and more specifically, to a deposition of memory cell electrode materials with low intrinsic roughness.

BACKGROUND

A storage device may include non-volatile memory, and three-dimensional memory cells have emerged as a solution to certain scaling limitations of traditional memory devices. Such three-dimensional memory cells may include a multi-deck non-volatile memory architecture that includes main tiles that are used for memory accesses (reads and writes) and termination tiles that surround the main tiles.

BRIEF DESCRIPTION OF THE DRAWINGS

Like reference numbers and designations in the various drawings indicate like elements.

DETAILED DESCRIPTION

A variety of memory and storage technologies include multiple decks or layers of memory cells as part of the vertical address space. Adding decks or layers of memory cells may result in a larger memory size per the same die size. Memory with multiple decks or layers (e.g., a multi-deck architecture in the vertical direction) is typically referred to as three-dimensional (3D). Examples of multi-deck or multi-layer memory architectures include multi-deck crosspoint memory and 3D NAND memory. Different memory technologies have adopted different terminology. For example, a deck in a crosspoint memory device typically refers to a layer of memory cell stacks that can be individually addressed. In contrast, a 3D NAND memory device is typically said to include a NAND array that includes many layers, as opposed to decks. In 3D NAND, a deck may refer to a subset of layers of memory cells (e.g., two decks of X-layers to effectively provide a 2X-layer NAND device). The term "deck" will be used throughout this disclosure to describe a layer, a tier, or a similar portion of a three-dimensional memory.

Figure 1:
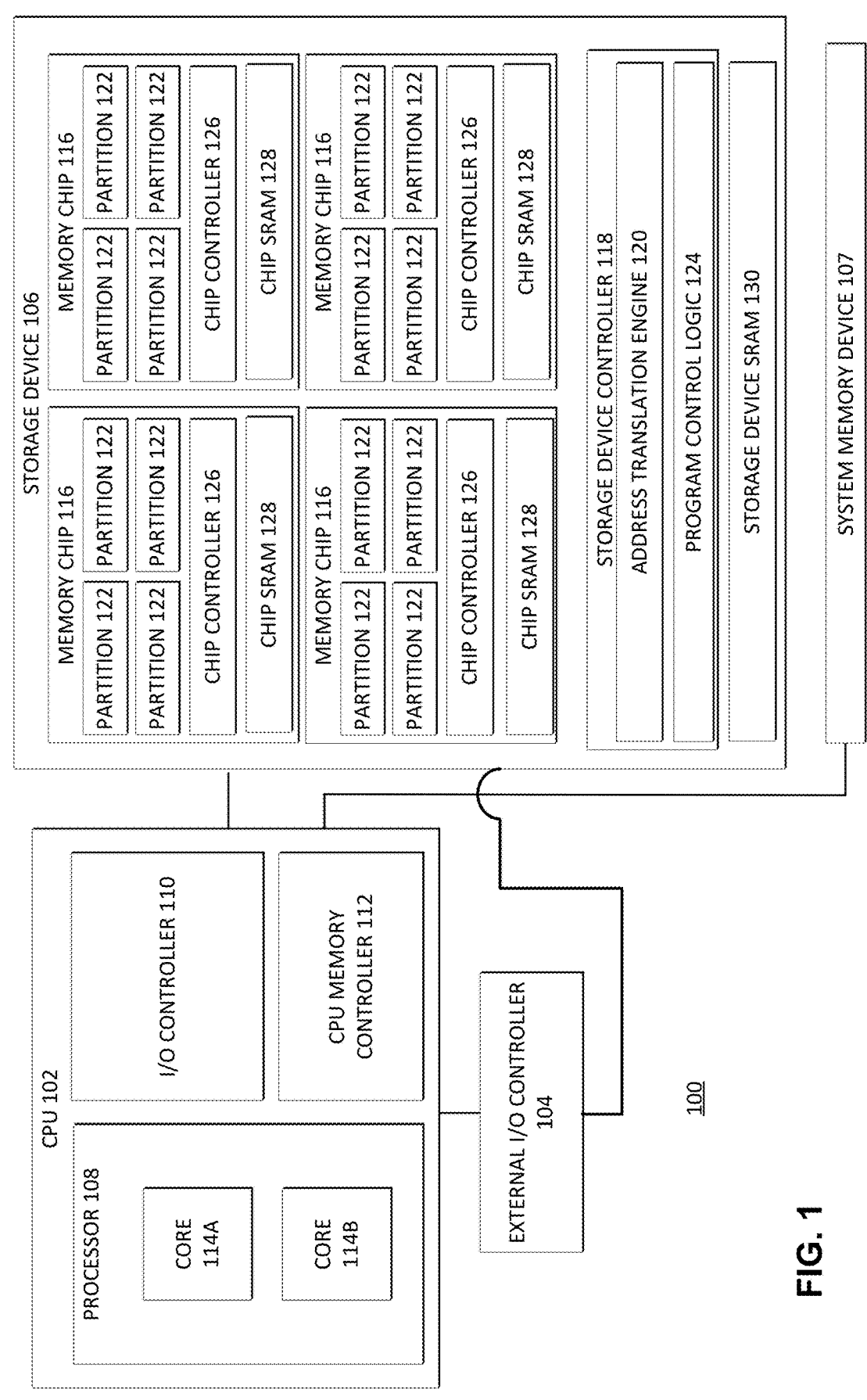
FIG. 1 is a schematic illustration of a block diagram of components of a computer system according to some embodiments.

FIG. 1 illustrates a block diagram of components of a computer system 100 in accordance with some embodiments. System 100 includes a central processing unit (CPU) 102 coupled to an external input/output (I/O) controller 104, a storage device 106 such as a solid state drive (SSD), and system memory device 107. During operation, data may be transferred between a storage device 106 and/or system memory device 107 and the CPU 102. In various embodiments, particular memory access operations (e.g., read and write operations) involving a storage device 106 or system memory device 107 may be issued by an operating system and/or other software applications executed by processor 108. In various embodiments, a storage device 106 may include a storage device controller 118 and one or more memory chips 116 that each comprise any suitable number of memory partitions 122.

In various embodiments, a memory partition 122 may include a 3D crosspoint memory array. In some embodiments, a 3D crosspoint memory array may comprise a transistor-less (e.g., at least with respect to the data storage elements of the memory) stackable crosspoint architecture in which memory cells sit at the intersection of row address lines and column address lines arranged in a grid.

During a read operation, a differential bias sometimes referred to as a demarcation voltage (VDM) may be applied across the terminals of the memory cell and the state of the memory cell may be sensed based on the reaction of the memory cell to the applied bias. For example, the memory cell may either go into a conductive ON state (logic one) or remain in a weakly conductive OFF state (logic zero). The applied voltage at which a memory cell transitions from being sensed as a logic one to being sensed as a logic zero may be termed a threshold voltage of the memory cell. Thus, as an example, when the VDM is higher than the threshold voltage of the memory cell, the memory cell may be sensed as storing a logic one and when the VDM is lower than the threshold voltage of the memory cell, the memory cell may be sensed as storing a logic zero.

CPU 102 comprises a processor 108, such as a microprocessor, an embedded processor, a digital signal processor (DSP), a network processor, a handheld processor, an application processor, a co-processor, an SOC, or other device to execute code (e.g., software instructions). Processor 108, in the depicted embodiment, includes two processing elements (cores 114A and 114B in the depicted embodiment), which may include asymmetric processing elements or symmetric processing elements. However, a processor may include any number of processing elements that may be symmetric or asymmetric. CPU 102 may be referred to herein as a host computing device (though a host computing device may be any suitable computing device operable to issue memory access commands to a storage device 106).

A processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket)

typically refers to an integrated circuit, which potentially includes any number of other processing elements, such as cores or hardware threads.

A core 114 (e.g., 114A or 114B) may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

The processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices, which may refer to any suitable logic capable of transferring data to and/or receiving data from an electronic system, such as CPU 102. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input device such as a monitor, printer, mouse, keyboard, or scanner; or other suitable device. In a particular embodiment, an I/O device may comprise storage device controller 118 of storage device 106 coupled to the CPU 102 through I/O controller 110. I/O circuitry (not shown) of the storage device controller 118 may be used for communication of data and signals between the CPU and the storage device controller 118 of storage device 106.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and an associated I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller 110 may be located off-chip (e.g., not on the same chip as CPU 102) or may be integrated on the same chip as the CPU 102.

CPU memory controller 112 is an integrated memory controller that controls the flow of data going to and from one or more system memory devices 107. CPU memory controller 112 may include logic operable to read from a system memory device 107, write to a system memory device 107, or to request other operations from a system memory device 107. In various embodiments, CPU memory controller 112 may receive write requests from cores 114 and/or I/O controller 110 and may provide data specified in these requests to a system memory device 107 for storage therein. CPU memory controller 112 may also read data from a system memory device 107 and provide the read data to I/O controller 110 or a core 114. During operation, CPU memory controller 112 may issue commands including one or more addresses of the system memory device 107 in order to read data from or write data to memory (or to perform other operations). In some embodiments, CPU memory controller 112 may be implemented on the same chip as CPU 102, whereas in other embodiments, CPU memory controller 112 may be implemented on a different chip than that of CPU 102. I/O controller 110 may perform similar operations with respect to one or more storage devices 106.

The CPU 102 may also be coupled to one or more other I/O devices through external I/O controller 104. In a particular embodiment, external I/O controller 104 may couple a storage device 106 to the CPU 102. External I/O controller 104 may include logic to manage the flow of data between one or more CPUs 102 and I/O devices. In particular embodiments, external I/O controller 104 is located on a motherboard along with the CPU 102. The external I/O controller 104 may exchange information with components of CPU 102 using point-to-point or other interfaces. According to an alternative embodiment, the external I/O controller 104 may be used to couple the CPU 102 to I/O devices other than the storage device 106, and the storage device 106 may be directly coupled to the CPU 102.

In the instant disclosure, I/O controller 110, CPU memory controller 112, external I/O controller 104 may each be referred to, from the standpoint of the storage device 106, as an "external controller."

A system memory device 107 may store any suitable data, such as data used by processor 108 to provide the functionality of computer system 100. For example, data associated with programs that are executed or files accessed by cores 114 may be stored in system memory device 107. Thus, a system memory device 107 may include a system memory that stores data and/or sequences of instructions that are executed or otherwise used by the cores 114. In various embodiments, a system memory device 107 may store temporary data, persistent data (e.g., a user's files or instruction sequences) that maintains its state even after power to the system memory device 107 is removed, or a combination thereof. A system memory device 107 may be dedicated to a particular CPU 102 or shared with other devices (e.g., one or more other processors or other devices) of computer system 100.

In various embodiments, a system memory device 107 may include a memory comprising any number of memory partitions, a memory device controller, and other supporting logic (not shown). A memory partition may include non-volatile memory and/or volatile memory.

Non-volatile memory is a storage medium that does not require power to maintain the state of data stored by the medium, thus non-volatile memory may have a determinate state even if power is interrupted to the device housing the memory. In various embodiments, non-volatile memory may be byte or block addressable. Nonlimiting examples of nonvolatile memory may include any or a combination of: solid state memory (such as planar or 3-dimensional (3D) NAND flash memory or NOR flash memory), 3D crosspoint memory, phase change memory or SXP memory (e.g., memory that uses a chalcogenide glass phase change material in the memory cells), ferroelectric memory, silicon-oxide-nitride-oxide-silicon (SONOS) memory, polymer memory (e.g., ferroelectric polymer memory), ferroelectric transistor random access memory (Fe-TRAM) ovonic memory, anti-ferroelectric memory, nanowire memory, electrically erasable programmable read-only memory (EEPROM), a memristor, single or multi-level phase change memory (PCM), Spin Hall Effect Magnetic RAM (SHE-MRAM), and Spin Transfer Torque Magnetic RAM (STTRAM), a resistive memory, magnetoresistive random access memory (MRAM) memory that incorporates memristor technology, resistive memory including the metal oxide base, the oxygen vacancy base and the conductive bridge Random Access Memory (CB-RAM), a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

Volatile memory is a storage medium that requires power to maintain the state of data stored by the medium (thus volatile memory is memory whose state (and therefore the data stored on it) is indeterminate if power is interrupted to the device housing the memory). Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (double data rate version 3, original release by JEDEC (Joint Electronic Device Engineering Council) on Jun. 27, 2007, currently on release 21), DDR4 (DDR version 4, JESD79-4 initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5, originally published by JEDEC in January 2020, HBM2 (HBM version 2), originally published by JEDEC in January 2020, or others or combinations of memory technologies, and technologies based on derivatives or extensions of such specifications.

A storage device 106 may store any suitable data, such as data used by processor 108 to provide functionality of computer system 100. For example, data associated with programs that are executed or files accessed by cores 114A and 114B may be stored in storage device 106. A storage device 106 may store data and/or sequences of instructions that are executed or otherwise used by the cores 114A and 114B. In various embodiments, a storage device 106 may store persistent data (e.g., a user's files or software application code) that maintains its state even after power to the storage device 106 is removed. A storage device 106 may be dedicated to CPU 102 or shared with other devices (e.g., another CPU or other device) of computer system 100.

In the embodiment depicted, storage device 106 includes a storage device controller 118 and four memory chips 116 each comprising four memory partitions 122 operable to store data, however, a storage device may include any suitable number of memory chips each having any suitable number of memory partitions. A memory partition 122 includes a plurality of memory cells operable to store data. The cells of a memory partition 122 may be arranged in any suitable fashion, such as in rows (e.g., wordlines) and columns (e.g., bitlines), three-dimensional structures, sectors, or in other ways. In various embodiments, the cells may be logically grouped into banks, blocks, subblocks, wordlines, pages, frames, bytes, slices, or other suitable groups. In various embodiments, a memory partition 122 may include any of the volatile or non-volatile memories listed above or other suitable memory. In a particular embodiment, each memory partition 122 comprises one or more 3D crosspoint memory arrays. 3D crosspoint arrays are described in more detail in connection with the following figures.

In various embodiments, storage device 106 may comprise a solid state drive; a memory card; a Universal Serial Bus (USB) drive; a Non-Volatile Dual In-line Memory Module (NVDIMM); storage integrated within a device such as a smartphone, camera, or media player; or other suitable mass storage device.

In a particular embodiment, one or more memory chips 116 are embodied in a semiconductor package. In various embodiments, a semiconductor package may comprise a casing comprising one or more semiconductor chips (also referred to as dies). A package may also comprise contact pins or leads used to connect to external circuits. In various embodiments, a memory chip may include one or more memory partitions 122.

Accordingly, in some embodiments, storage device 106 may comprise a package that includes a plurality of chips that each include one or more memory partitions 122. However, a storage device 106 may include any suitable arrangement of one or more memory partitions and associated logic in any suitable physical arrangement. For example, memory partitions 122 may be embodied in one or more different physical mediums, such as a circuit board, semiconductor package, semiconductor chip, disk drive, other medium, or any combination thereof.

System memory device 107 and storage device 106 may comprise any suitable types of memory and are not limited to a particular speed, technology, or form factor of memory in various embodiments. For example, a storage device 106 may be a disk drive (such as a solid-state drive), a flash drive, memory integrated with a computing device (e.g., memory integrated on a circuit board of the computing device), a memory module (e.g., a dual in-line memory module) that may be inserted in a memory socket, or other type of storage device. Similarly, system memory 107 may have any suitable form factor. Moreover, computer system 100 may include multiple different types of storage devices.

System memory device 107 or storage device 106 may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. A system memory device 107 or storage device 106 may also include a communication interface to communicate with CPU memory controller 112 or I/O controller 110 in accordance with any suitable logical device interface specification such as NVMe, AHCI, or other suitable specification. In particular embodiments, system memory device 107 or storage device 106 may comprise multiple communication interfaces that each communicate using a separate protocol with CPU memory controller 112 and/or I/O controller 110.

Storage device controller 118 may include logic to receive requests from CPU 102 (e.g., via an interface that communicates with CPU memory controller 112 or I/O controller 110), cause the requests to be carried out with respect to the memory chips 116, and provide data associated with the requests to CPU 102 (e.g., via CPU memory controller 112 or I/O controller 110). Storage device controller 118 may also be operable to detect and/or correct errors encountered during memory operations via an error correction code (ECC engine). In an embodiment, controller 118 also tracks, e.g., via a wear leveling engine, the number of times particular cells (or logical groupings of cells) have been written to in order to perform wear leveling, detect when cells are nearing an estimated number of times they may be reliably written to, and/or adjust read operations based on the number of times cells have been written to. In performing wear leveling, the storage device controller 118 may evenly spread out write operations among the cells of memory chips 116 in an attempt to equalize the number of operations (e.g., write operations) performed by each cell. In various embodiments, controller 118 may also monitor various characteristics of the storage device 106 such as the temperature or voltage and report associated statistics to the CPU 102. Storage device controller 118 can be implemented on the same circuit board or device as the memory chips 116 or on a different circuit board or device. For example, in some environments, storage device controller 118 may be a centralized storage controller that manages memory operations for multiple different storage devices 106 of computer system 100.

In various embodiments, the storage device 106 also includes program control logic 124 which is operable to control the programming sequence performed when data is written to or read from a memory chip 116. In various embodiments, program control logic 124 may provide the various voltages (or information indicating which voltages should be provided) that are applied to memory cells during the programming and/or reading of data (or perform other operations associated with read or program operations), perform error correction, and perform other suitable functions.

In various embodiments, the program control logic 124 may be integrated on the same chip as the storage device controller 118 or on a different chip. In the depicted embodiment, the program control logic 124 is shown as part of the storage device controller 118, although in various embodiments, all or a portion of the program control logic 124 may be separate from the storage device controller 118 and communicably coupled to the storage device controller 118. For example, all or a portion of the program control logic 124 described herein may be located on a memory chip 116. In various embodiments, reference herein to a "controller" may refer to any suitable control logic, such as storage device controller 118, chip controller 126, or a partition controller. In some embodiments, reference to a controller may contemplate logic distributed on multiple components, such as logic of a storage device controller 118, chip controller 126, and/or a partition controller.

In various embodiments, storage device controller 118 may receive a command from a host device (e.g., CPU 102), determine a target memory chip for the command, and communicate the command to a chip controller 126 of the target memory chip. In some embodiments, the storage device controller 118 may modify the command before sending the command to the chip controller 126.

In various embodiments, the storage device controller 118 may send commands to memory chips 116 to perform host-initiated read operations as well as device-initiated read operations. A host-initiated read operation may be performed in response to reception of a read command from a host coupled to the storage device 106, such as CPU 102. A device-initiated read operation may be a read operation that is performed in response to a device-initiated read command generated by the storage device 106 independent of receiving a read command from the host. In various embodiments, the storage device controller 118 may be the component that generates device-initiated read commands. The storage device 106 may initiate a device-initiated read command for any suitable reason. For example, upon power up of a storage device, the storage device 106 may initiate a plurality of read and write-back commands to re-initialize data of the storage device 106 (e.g., to account for any drift that has occurred while the storage device 106 or a portion thereof was powered off or has sat idle for a long period of time).

The chip controller 126 may receive a command from the storage device controller 118 and determine a target memory partition 122 for the command. The chip controller 126 may then send the command to a controller of the determined memory partition 122. In various embodiments, the chip controller 126 may modify the command before sending the command to the controller of the partition 122.

In some embodiments, all or some of the elements of system 100 are resident on (or coupled to) the same circuit board (e.g., a motherboard). In various embodiments, any suitable partitioning between the elements may exist. For example, the elements depicted in CPU 102 may be located on a single die (e.g., on-chip) or package or any of the elements of CPU 102 may be located off-chip or off-package. Similarly, the elements depicted in storage device 106 may be located on a single chip or on multiple chips. In various embodiments, a storage device 106 and a computing host (e.g., CPU 102) may be located on the same circuit board or on the same device and in other embodiments the storage device 106 and the computing host may be located on different circuit boards or devices.

The components of system 100 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments, an integrated I/O subsystem includes point-to-point multiplexing logic between various components of system 100, such as cores 114, one or more CPU memory controllers 112, I/O controller 110, integrated I/O devices, direct memory access (DMA) logic (not shown), etc. In various embodiments, components of computer system 100 may be coupled together through one or more networks comprising any number of intervening network nodes, such as routers, switches, or other computing devices. For example, a computing host (e.g., CPU 102) and the storage device 106 may be communicably coupled through a network.

Although not depicted, system 100 may use a battery and/or power supply outlet connector and associated system to receive power, a display to output data provided by CPU 102, or a network interface allowing the CPU 102 to communicate over a network. In various embodiments, the battery, power supply outlet connector, display, and/or network interface may be communicatively coupled to CPU 102. Other sources of power can be used such as renewable energy (e.g., solar power or motion based power).

Storage device SRAM/DRAM 130 and chip SRAM/DRAM 128 each are adapted to execute internal firmware or software of the storage device 106 and memory chip 116, respectively. For example, the logic to be implemented by program control logic 124, upon the issuance of a command, for example from the host or CPU 102 to execute the logic, may be moved from a memory storing the logic to SRAM/ DRAM 130 such that the logic may be executed by the storage device controller 118 which will have access to the logic instructions by way of the associated SRAM/DRAM 128. Similarly, the logic to be implemented by the chip controller 126, upon the issuance of a command, for example from the host or CPU 102 to execute the logic, may be moved from a memory storage the logic to the associated SRAM/DRAM 128 (or another type of memory) such that the logic may be executed by the associated chip controller 126 which will have access to the logic instructions by way of the associated SRAM/DRAM 128.

Figure 2:
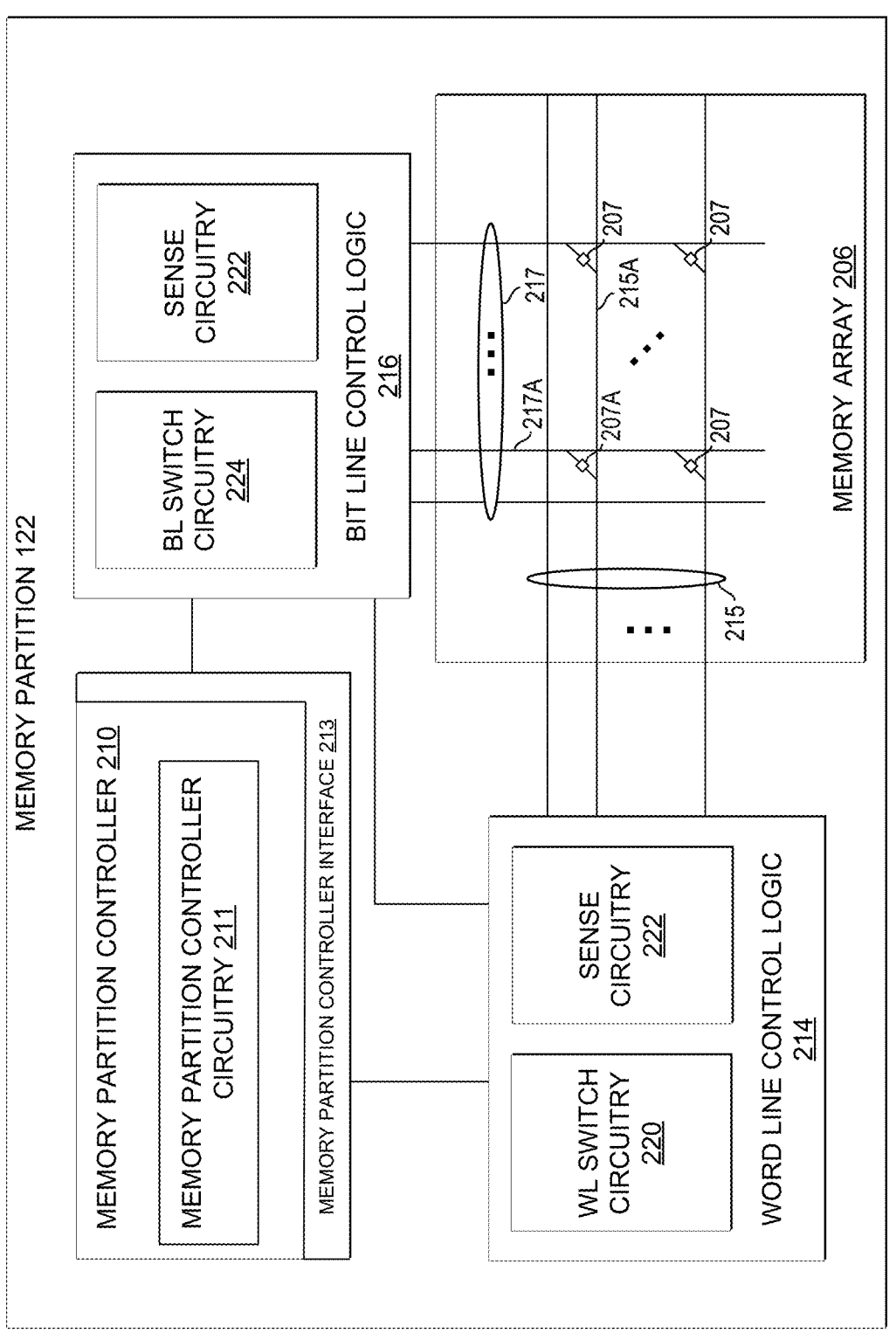
FIG. 2 is a schematic illustration of a memory partition in accordance with certain embodiments.

FIG. 2 illustrates a detailed exemplary view of the memory partition 122 of FIG. 1 in accordance with certain embodiments. In one embodiment, a memory partition 122 may include 3D crosspoint memory which may include phase change memory or other suitable memory types. In a particular embodiment, phase change memory may utilize a chalcogenide material for memory elements. A memory element is a unit of a memory cell that actually stores the information. In operation, phase change memory may store information on the memory element by changing the phase of the memory element between amorphous and crystalline phases. The memory element (e.g., that includes a phase change material such as a chalcogenide material) may be referred to as a "PM" portion of the memory cell. The material of a memory element (e.g., the chalcogenide material) may exhibit either a crystalline or an amorphous phase, exhibiting a low or high conductivity. Generally, the amorphous phase has a low conductivity (high impedance) and is associated with a reset state (logic zero) and the crystalline phase has a high conductivity (low impedance) and is associated with a set state (logic one). The memory element may be included in a memory cell 207 (e.g., a phase change memory cell) that also includes a selector, e.g., a select device (SD) coupled to the memory element. The SD regions of the memory cell 207 may be configured to facilitate combining a plurality of memory elements into an array. The SD region of the memory cell 207 may be made of, or include, a chalcogenide material. The SD region may be made of a different chalcogenide material than the PM region.

In some embodiments, a 3D crosspoint memory array 206 may comprise a transistor-less (e.g., at least with respect to the data storage elements of the memory) stackable crosspoint architecture in which memory cells 207 sit at the intersection of row address lines and column address lines arranged in a grid. The row address lines 215 and column address lines 217, called word lines (WLs) and bit lines (BLs), respectively, cross in the formation of the grid and each memory cell 207 is coupled between a WL and a BL where the WL and BL cross (e.g., at a crosspoint). At the point of a crossing, the WL and BL may be located at different vertical planes such that the WL crosses over the BL but does not physically touch the BL. As described above, the architecture may be stackable, such that a word line may cross over a bit line located beneath the word line and another bit line for another memory cell located above the word line. It should be noted that row and column are terms of convenience used to provide a qualitative description of the arrangement of WLs and BLs in crosspoint memory. In various embodiments, the cells of the 3D crosspoint memory array may be individually addressable.

In some embodiments, bit storage may be based on a change in bulk resistance of a 3D crosspoint memory cell. In various embodiments, 3D crosspoint memory may include any of the characteristics of 3D XPoint memory manufactured by INTEL CORPORATION (Optane™ is the Intel Trademark for Intel's 3D crosspoint (3D Xpoint™) technology).

During a programming operation (e.g., a write operation), the phase of the memory element may be changed by the application of a first bias voltage to the WL and a second bias voltage to the BL resulting in a differential bias voltage across the memory cell that may cause a current to flow in the memory element. The differential bias voltage may be maintained across the memory cell for a time period sufficient to cause the memory element to "snap back" and to transition the memory element from the amorphous state to the crystalline state or from the crystalline state to the amorphous state (e.g., via the application of heat produced by an electric current). Snap back is a property of the composite memory element that results in an abrupt change in conductivity and an associated abrupt change in the voltage across the memory element.

In a read operation, a target memory cell is selected via the application of a first bias voltage to the selected WL and a second bias voltage to the selected BL that cross at the target memory cell for a time interval. A resulting differential bias voltage (a demarcation read voltage (VDM)) across the memory element is configured to be greater than a maximum set voltage and less than a minimum reset voltage for the memory element. Selection of the selected WL and selected BL and application of the first bias and second bias voltage may be implemented by a decoder in a switch circuitry, such as WL switch circuitry 220 and BL switch circuitry 224. In response to application of the VDM, the target memory element may or may not snap back, depending on whether the memory element is in the crystalline state (set) or the amorphous state (reset). Sense circuitry, coupled to the memory element, is configured to detect the presence or absence of snap back in a sensing time interval. The presence of snap back may then be interpreted as a logic one and the absence of snap back as a logic zero.

The differential bias at which a memory cell transitions from being sensed as a logic one (e.g., due to the memory cell snapping back) to being sensed as a logic zero (e.g., due to the memory cell not snapping back), may be termed a threshold voltage (sometimes referred to as a snap back voltage). Thus, when the VDM is higher than the threshold voltage of the memory cell, the memory cell may be sensed as storing a logic one and when the VDM is lower than the threshold voltage of the memory cell, the memory cell may be sensed as storing a logic zero.

In some embodiments, an applied bias such as the VDM of a read pulse may be high enough to only turn on 3D crosspoint cells in the crystalline state, which may have a lower threshold voltage than 3D crosspoint cells in the amorphous state. In some embodiments, the VDM may be supplied through negative and/or positive regulated nodes. For example, the bitline electrode of the 3D crosspoint cell may be a positive regulated node and the wordline electrode coupled to the cell may supply the bias for VDM.

For a write operation or a read operation, one memory cell 207A out of many cells, such as thousands of cells, may be selected as the target cell for the read or write operation, the cell being at the cross section of a BL 217A and a WL 215A. All cells coupled to BL 217A and all cells coupled to WL 215A other than cell 207A may still receive a portion of VDM (e.g., approximately ½ of VDM), with only cell 207A receiving the full VDM.

In the embodiment of FIG. 2, a memory partition 122 includes memory partition controller 210, word line control logic 214, bit line control logic 216, and memory array 206. A host device (e.g., CPU 102) may provide read and/or write commands including memory address(es) and/or associated data to memory partition 122 (e.g., via storage device controller 118 and chip controller 126) and may receive read data from memory partition 122 (e.g., via the chip controller 126 and storage device controller 118). Similarly, storage device controller 118 may provide host-initiated read and write commands or device-initiated read and write commands including memory addresses to memory partition 122 (e.g., via chip controller 126). Memory partition controller 210 (in conjunction with word line control logic 214 and bit line control logic 216) is configured to perform memory access operations, e.g., reading one or more target memory cells and/or writing to one or more target memory cells.

Memory array 206 corresponds to at least a portion of a 3D crosspoint memory (e.g., that may include phase change memory cells or other suitable memory cells) and includes a plurality of word lines 215, a plurality of bit lines 217 and a plurality of memory cells, e.g., memory cells 207. Each memory cell is coupled between a word line ("WL") and a bit line ("BL") at a crosspoint of the WL and the BL. Each memory cell includes a memory element configured to store information and may include a memory cell select device (e.g., selector) coupled to the memory element. Select devices may include ovonic threshold switches, diodes, bipolar junction transistors, field-effect transistors, etc. Memory array 206 may be configured to store binary data and may be written to (e.g., programmed) or read from.

Memory partition controller 210 may manage communications with chip controller 126 and/or storage device controller 118. In a particular embodiment, memory partition controller 210 may analyze one or more signals received from another controller to determine whether a command sent via a bus is to be consumed by the memory partition 122. For example, controller 210 may analyze an address of the command and/or a value on an enable signal line to determine whether the command applies to the memory partition 122. Controller 210 may be configured to identify one or more target WLs and/or BLs associated with a received memory address (this memory address may be a separate address from the memory partition address that identifies the memory partition 122, although in some embodiments a portion of an address field of a command may identify the memory partition while another portion of the address field may identify one or more WLs and/or BLs). Memory partition controller 210 may be configured to manage operations of WL control logic 214 and BL control logic 216 based, at least in part, on WL and/or BL identifiers included in a received command. Memory partition controller 210 may include memory partition controller circuitry 211, and a memory controller interface 213. Memory controller interface 213, although shown as a single block in FIG. 2, may include a plurality of interfaces, for example a separate interface for each of the WL control logic 214 and the BL control logic 216.

WL control logic 214 includes WL switch circuitry 220 and sense circuitry 222. WL control logic 214 is configured to receive target WL address(es) from memory partition controller 210 and to select one or more WLs for reading and/or writing operations. For example, WL control logic 214 may be configured to select a target WL by coupling a WL select bias voltage to the target WL. WL control logic 214 may be configured to deselect a WL by decoupling the target WL from the WL select bias voltage and/or by coupling a WL deselect bias voltage to the WL. WL control logic 214 may be coupled to a plurality of WLs 215 included in memory array 206. Each WL may be coupled to a number of memory cells corresponding to a number of BLs 217. WL switch circuitry 220 may include a plurality of switches, each switch configured to couple (or decouple) a respective WL, e.g., WL 215A, to a WL select bias voltage to select the respective WL 215A. For example, WL switch circuitry 220 may include a plurality of switches that each correspond to a particular WL. In one embodiment, each switch includes a pair of metal oxide semiconductor field effect transistors (MOSFETs) comprising a positive-type (p-type) metal oxide semiconductor transistor (PMOS) and a negative-type (n-type) MOS transistor (NMOS). The pair may form a complementary MOS circuit (CMOS).

BL control logic 216 includes BL switch circuitry 224. In some embodiments, BL control logic 216 may also include sense circuitry, e.g., sense circuitry 222. BL control logic 216 is configured to select one or more BLs for reading and/or writing operations. BL control logic 216 may be configured to select a target BL by coupling a BL select bias voltage to the target BL. BL control logic 216 may be configured to deselect a BL by decoupling the target BL from the BL select bias voltage and/or by coupling a BL deselect bias voltage to the BL. BL switch circuitry 224 is similar to WL switch circuitry 220 except BL switch circuitry 224 is configured to couple the BL select bias voltage to a target BL.

Sense circuitry 222 is configured to detect the state of one or more sensed memory cells 207 (e.g., via the presence or absence of a snap back event during a sense interval), e.g., during a read operation. Sense circuitry 222 is configured to provide a logic level output related to the result of the read operation to, e.g., memory partition controller 210. For example, a logic level corresponding to a logic one may be output if the applied VDM is higher than the memory cell's threshold voltage or a logic zero if the applied VDM is lower than the memory cell's threshold voltage. In a particular embodiment, a logic one may be output if a snap back is detected and a logic zero may be output if a snap back is not detected.

As an example, in response to a signal from memory partition controller 210, WL control logic 214 and BL control logic 216 may be configured to select a target memory cell, e.g., memory cell 207A, for a read operation by coupling WL 215A to WL select bias voltage and BL 217A to BL select bias voltage as well as coupling the other WLs and BLs to respective deselect bias voltages. One or both of sense circuitries 222 may then be configured to monitor WL 215A and/or BL 217A for a sensing interval in order to determine the state of the memory cell 207A (e.g., to determine whether or not a snap back event occurs). For example, if a sense circuitry 222 detects a snap back event, then memory cell 207A may be in the set state, but if a sense circuitry 222 does not detect a snap back event in the sensing interval, then memory cell 207A may be in the reset state.

Thus, WL control logic 214 and/or BL control logic 216 may be configured to select a target memory cell for a read operation, initiate the read operation, sense the selected memory cell (e.g., for a snap back event) in a sensing interval, and provide the result of the sensing to, e.g., memory partition controller 210.

In a particular embodiment, the sense circuitry 222 may include a WL load connected to a WL electrode or gate, and a BL load connected to a BL electrode or gate. When a particular wordline and bitline are selected in the array, a difference between WL load or WL voltage and the BL voltage corresponds to a read VDM. VDM may induce a current (icell) in the memory cell 207A. A comparator such as a sense amplifier may compare icell with a reference current in order to read a logic state one or logic state zero depending on whether the memory cell is a set cell or a reset cell. The reference current may thus be selected such that the current of the target memory cell is lower than the reference current before snapback of the target memory cell and higher than the reference current after snapback of the target memory cell. In this manner, an output of the sense amplifier/comparator may be indicative of a state of the target memory cell. A latch may be coupled to the output of the comparator to store the output of the read operation.

For each matrix of arrays, there may be a number of sense amplifiers provided, with the sense circuitry 222 able to process up to a maximum number of sensed bits, such as 128 bits, from the sense amplifiers at one time. Hence, 128 memory cells may be sensed at one time by sense amplifiers of the sense circuitry 222.

Figure 3:
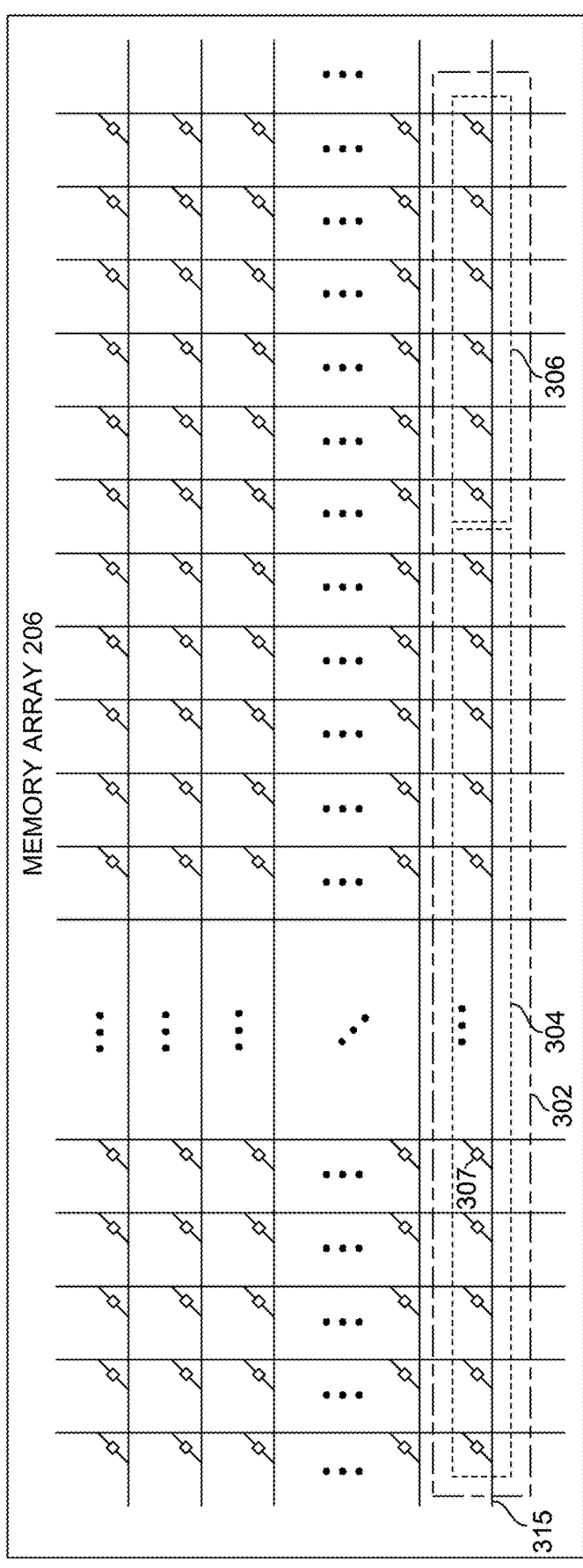
FIG. 3 is a schematic illustration of a memory array in accordance with certain embodiments.

FIG. 3 illustrates a detailed exemplary view of the memory array 206 of FIG. 2 in accordance with certain embodiments. In various embodiments, a plurality of memory cells 307 of memory array 206 may be divided into a logical group such as a slice 302 (and the memory array 206 may include a plurality of slices). In the embodiment depicted, slice 302 includes a plurality of memory cells 307 coupled to the same WL 315, though a slice 302 may comprise any suitable arrangement of memory cells.

In a particular embodiment, a slice may include a payload portion 304 and a metadata portion 306. The memory cells of the payload portion 304 may store data written to the storage device 106 by a host (e.g., CPU 102/104). For example, the host may send a write command specifying payload data to be written to the storage device 106 at a particular logical address. The payload of the write command may be stored in a payload portion 304 of one or more slices 302 (in various embodiments, the payload portion 304 may be large enough to hold payload data from multiple write commands from the host). In various embodiments, the size of the payload portion of a slice may have any suitable size, such as 1 kibibyte (KiB), 2 KiB, 4 KiB, 8 KiB, or other suitable size.

The memory cells of the metadata portion 306 of a slice 302 may store metadata associated with the payload data stored in the payload portion 304 of the slice 302 or the slice itself. The metadata portion 306 may store any suitable metadata associated with the payload data or slice. For example, the metadata portion 306 may store parity bits and/or cyclic redundancy check (CRC) bits used during error detection and error correction, e.g., by the storage device controller 118. In alternative embodiments, error detection and/or correction may be performed at any suitable level on the storage device 106, such as by the chip controllers 126 or partition controllers.

Figure 4:
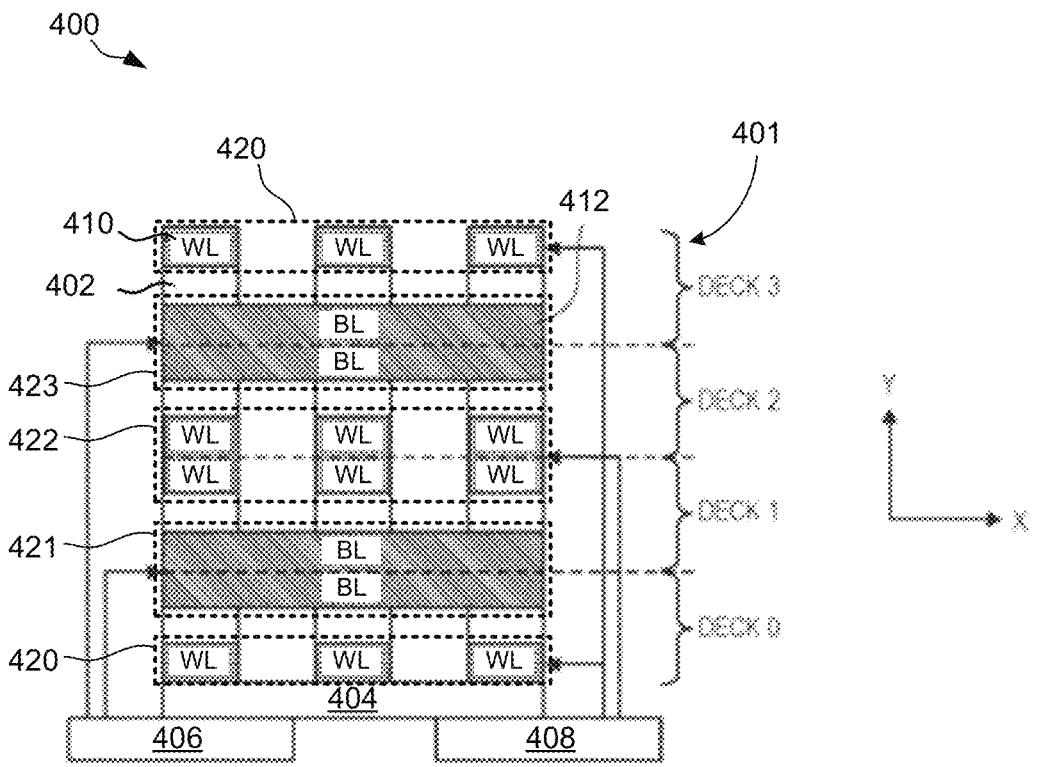
FIG. 4 is a block diagram of an example of a multi-deck non-volatile memory device according to some embodiments.

FIG. 4 is a block diagram of an example of a multi-deck non-volatile memory device 400 according to some embodiments. As illustrated, the multi-deck non-volatile memory device 400 may include a plurality of decks 401 (e.g., Deck 0, Deck 1, Deck 2, and Deck 3, or the like).

In some implementations, each of the decks 401 may include an array of memory cells 402 with conductive access lines (e.g., wordlines 410 and bitlines 412). For example, the memory cells 402 may include a material capable of being in two or more stable states to store a logic value. In one example, the memory cells 402 may include a phase change material, a chalcogenide material, the like, or combinations thereof. However, any suitable storage material may be utilized. The wordlines 410 and bitlines 412 may be patterned so that the wordlines 410 are orthogonal to the bitlines 412, creating a grid pattern or "cross-points." A cross-point may refer to an intersection between a bitline, a wordline, and active material(s) (e.g., a selector (select device (SD) region) and/or a storage material (e.g., phase change material (PM) region)). A memory cell 402 may be located at the intersection of a wordline 410 and a bitline 412. Accordingly, one or more of the decks 401 may include a crosspoint array of non-volatile memory cells, where each of the memory cells may include a material capable of being in two or more stable states to store a logic value.

As illustrated, an electrically isolating material 404 may separate the conductive access lines (e.g., wordlines 410 and bitlines 412) of the bottom deck (e.g., deck 0) from bitline sockets 406 and wordline sockets 408. For example, the memory cells 402 may be coupled with access and control circuitry for operation of the three-dimensional memory device 400 via the bitline sockets 406 and the wordline sockets 408.

Further, as illustrated, the bitlines and wordlines are organized in layers, with each layer being split between decks. In particular, there are two bitline layers 421, 423 and two wordline layers 420, 422. As shown, the wordline layer 420 is split between decks 0 and 3 as two conductors activated by a first signal from socket 408, while the wordline layer 422 is one conductor material that is split between decks 1 and 2 and activated by a second signal from socket 408. The bitline layer 421 includes one conductor material that is activated with a first signal by the socket 406, and the bitline layer 423 includes one conductor material that is activated with a second signal by the socket 406. The bitline layer 421 is split between decks 0 and 1 (with the activation of a memory cell in deck 0 or 1 being dictated by activation of wordline layer 420 or 422, respectively), while the bitline layer 423 is split between decks 2 and 3 (with the activation of a memory cell in deck 2 or 3 being dictated by activation of wordline layer 422 or 420, respectively). Since the wordline layer 420 is routed in 2 different vertical locations, it is only a 1× thickness in each location, while wordline layer 422 connects to 2× the number of memory cells as each wordline layer 420 bus and is accordingly routed at a 2× thickness so that the RCs of wordline layer 422 matches the RC of each bus of wordline layer 420. Further, the bitline layers 421, 423 are also routed at 2× thickness to match the RCs of the bitlines to the wordlines.

The crosspoint memory array of FIG. 4 is one example of multi-deck non-volatile memory device 400, however, the techniques described herein may not be limited to crosspoint memory, but any memory device with multiple layers or decks of memory cells. Thus, memory systems may be designed to have one or more packages, each of which may include one or more memory dies, and each memory die may include multiple partitions and multiple decks.

Figure 5:
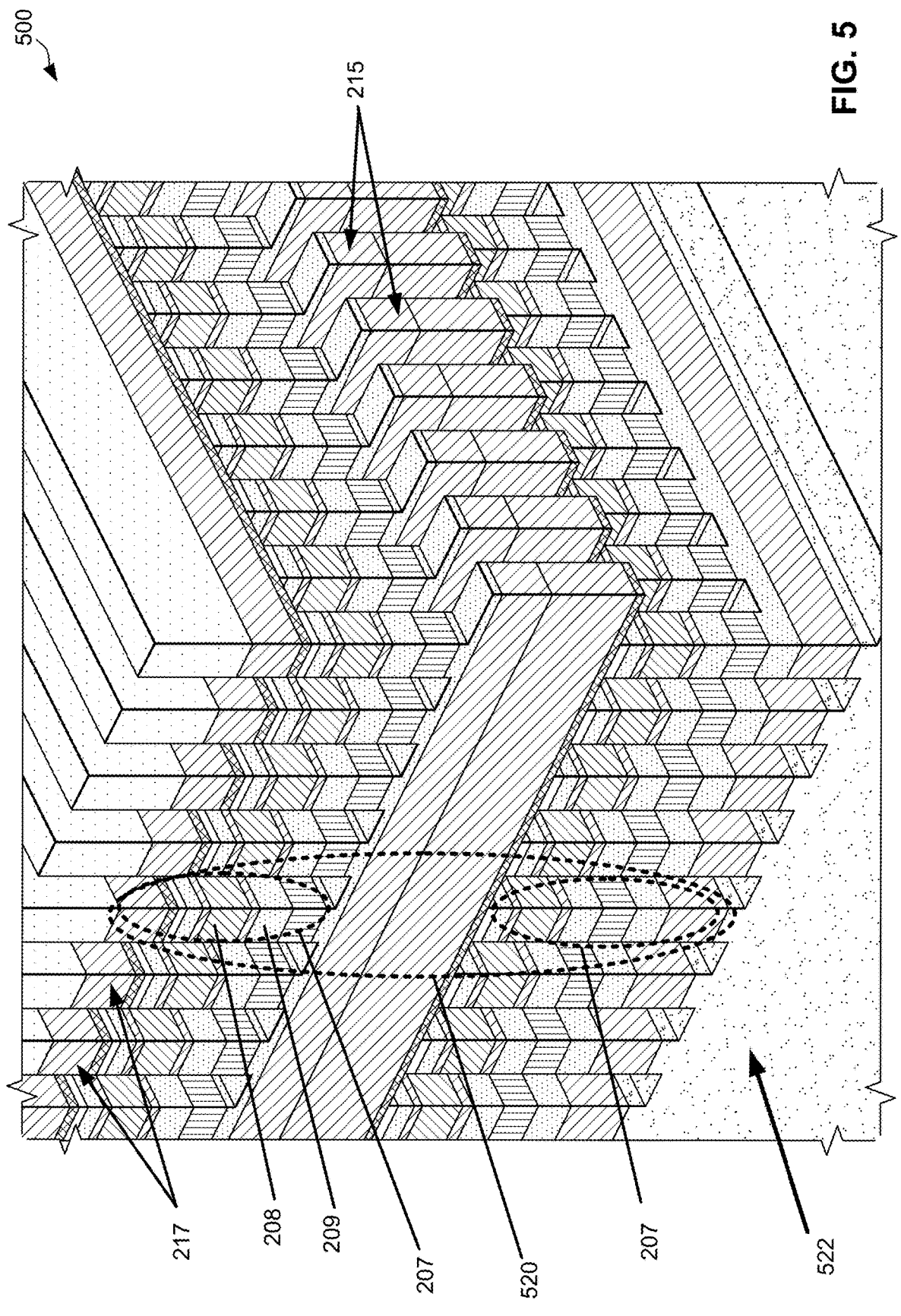
FIG. 5 is a perspective diagram of an example stack of memory cells of a multi-deck non-volatile memory device in accordance with embodiments herein.

FIG. 5 is a perspective diagram of an example stack 500 of memory cells of a multi-deck non-volatile memory device (e.g., 400) in accordance with embodiments herein. The example multi-deck non-volatile memory device may be referred to as a crosspoint memory device in some instances. The specific layers shown in FIG. 5 are merely examples, and will not be described in detail here.

The example stack 500 shown in FIG. 5 is built on a substrate structure 522, such as silicon or other semiconductor. The stack 500 includes multiple pillars 520 with stacks of memory cells 207. In the diagram 500, it will be observed that there are wordlines (WL) 215 and bitlines (BL) 217 that are orthogonal to each other, and traverse or cross each other in a cross-hatch pattern. A crosspoint memory structure as shown includes at least one memory cell in a stack between layers of BL and WL. As illustrated, WLs 215 are in between layers of elements, and BLs 217 are located at the top of the circuit. Such a configuration is only an example, and the BL and WL structure can be swapped. Thus, in one representation of the stack 500, the WLs can be the metal structures labeled as 217, and the BLs can be the metal structures labeled as 215. In one example, the BL and WL are made of tungsten metal. In some instances, WLs and BLs can be referred to as address lines, referring to signal lines used to address memory cells. Different architectures can use different numbers of stacks of devices, and different configuration of WLs and BLs.

At least some of WLs 215 may correspond to WLs 215 of FIG. 2. At least some of the BLs 217 may correspond to BLs 217 of FIG. 2. The substrate structure 522 may include control circuitry therein (not shown), such as control circuitry including transistors, row decoders, page buffers, etc. Memory cells 207 may correspond to memory cells 207 of FIG. 2. The control circuitry of substrate structure 522 may include, for example, a memory partition controller such as memory partition controller 210, BL control logic such as BL control logic 216, and WL control logic such as WL control logic 214 of FIG. 2. Each row of WLs 215 extending in the Y direction, the corresponding cells as coupled to corresponding BLs, would define a memory array, and may correspond to a memory array such as memory array 206 of FIGS. 2 and 3. Some of the WLs and some of the BLs may include dummy WLs or dummy BLs (not shown in FIG. 5), corresponding to the dummy WLs and dummy BLs in the dummy array 206B of FIGS. 2 and 3.

Each memory cell 207 of the stack 500 includes a phase change material (PM) layer 208 and select device (SD) layer 209 in series between the WLs 215 and BLs 217. The PM layer 208 and SD layer 209 may be composed of chalcogenide materials as described above. Although shown in a particular order/stack between the WLs 215 and BLs 217, the PM layer 208 and SD layer 209 of the memory cell 207 may be in a different order/stack.

Figure 6:
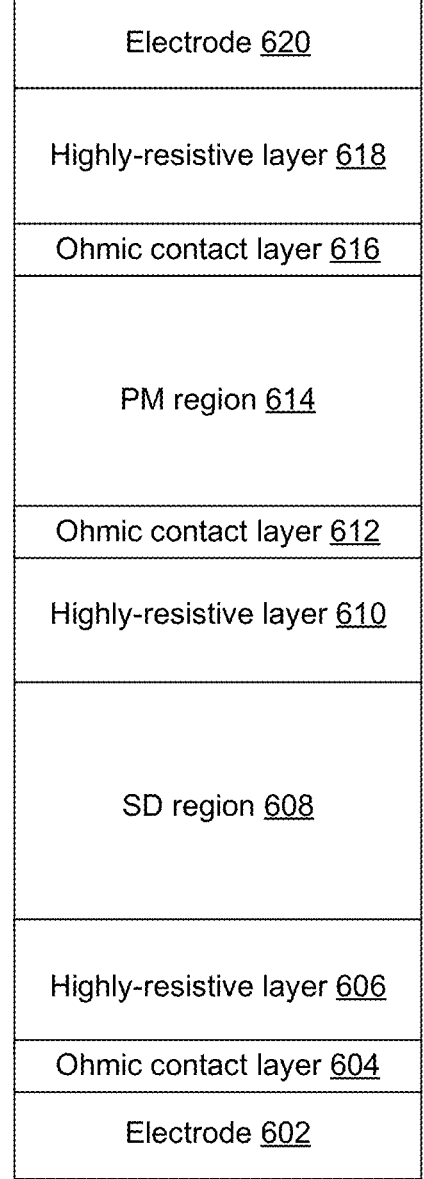
FIG. 6 is a diagram of an example material layer stack for a memory cell in accordance with embodiments herein.

FIG. 6 is a diagram of an example material layer stack 600 for a memory cell in accordance with embodiments herein. The example stack 600 shown in FIG. 6 may be used to form memory cells in a crosspoint memory structure, such as the memory cells 207 shown in FIGS. 2 and 5, or the cells 402 of FIG. 4. While a particular stack of materials is shown in FIG. 6, other material layers may be included in certain embodiments, or certain layers may be omitted from certain embodiments.

In the example shown, the stack 600 includes a first electrode 602, an ohmic contact layer 604 on the first electrode 602, a highly-resistive material layer 606 on the ohmic contact layer 604, a SD region 608 on the highly-resistive material layer 606, another highly-resistive material layer 610 on the SD region 608, an ohmic contact layer 612 on the highly-resistive material layer 610, a PM region 614 on the ohmic contact layer 612, an ohmic contact layer 616 on the PM region 614, another highly-resistive material layer 618 on the ohmic contact layer 616, and an electrode 620 on the highly-resistive material layer 618. In certain embodiments, each of the ohmic contact layers may be formed of a Tungsten (W)-based material and each of the highly-resistive material layers may be formed of a Carbon (C)-based material. For example, in some embodiments, the highly-resistive material layers may be formed as Carbon or Carbon Nitride films. As another example, in some embodiments, the ohmic contact layers 612, 616 may be formed of Tungsten (W), while the ohmic contact layer 604 may be formed of Tungsten Silicon Nitride (WSiN). In some embodiments, the electrodes 602, 620 may be metals, e.g., Tungsten, and may form at least a portion of an address line (e.g., BL or WL) as described above.

The highly-resistive material layer 610 of the stack may be used to provide sufficient joule heating for phase transformation in the PM region 614 (e.g., to encode a state in the memory cell), and the ohmic contact layer 612 may provide a good ohmic contact between the PM region 614 and the SD region 608. However, current deposition techniques for the highly-resistive material layer 610 (and/or other highly-resistive material layers of the stack) may cause the intrinsic roughness of the layer to result in discontinuities of the ohmic contact layer 612. Because the ohmic contact layer 612 also serves as a diffusion barrier layer for the PM region 614, deposition of the layer on top of an intrinsically rough resistive layer may produce discontinuities in the ohmic contact layer, which can result in one or both of: (a) high ohmic contact resistance that adversely affects the memory cell parameters. or (b) a potential diffusion path between the PM region 614 and the SD region 608, causing cross-contamination of the two regions, resulting in poor device performance and potential device failure.

Current deposition techniques for the highly-resistive material layer involve the use of a two-layer carbon film composed of a thicker film deposited under an unbiased condition followed by a thinner film deposited under an AC bias. However, this technique has not been sufficient to reduce roughness in the resistive layer, with the resistive layers having a resulting roughness of approximately 12 A (based on X-Ray Reflectivity measurements), which may represent approximately 8% of the layer's overall thickness. This, in turn has resulted in the loss and potential cross-contamination between the PM and SD regions in memory cells.

However, according to embodiments herein, one or more of the highly-resistive material layers may be deposited at certain conditions that may allow for a lower intrinsic roughness of the layers, e.g., having a roughness of <3% of the layer's overall thickness, which may prevent cross-contamination between the PM and SD regions of memory cells. For instance, in certain embodiments, the highly-resistive material layer may be deposited using a vapor deposition techniques (e.g., physical vapor deposition (e.g., sputtering) (PVD), chemical vapor deposition (CVD), atomic layer deposition (ALD), etc.) at relatively low temperature (e.g., between approximately 20-40 C) to attain a smoother layer surface and thus, a smoother ohmic contact layer deposited on top of the resistive layer. This may allow for continuous, smooth, and higher density barrier layers with an intimate ohmic contact (e.g., with the contact layer 612 in FIG. 6). Because of the higher density resulting from embodiments herein, the thickness of the highly-resistive material layer (e.g., 610) may be less than in current implementations, potentially reducing the stack height of memory cells in a crosspoint memory device. As an example, based on atomic force microscopy (AFM) measurements, a highly-resistive layer deposited under current techniques may yield a root mean square roughness measure of $R_q$=0.069 nm and an average roughness measure of $R_a$=0.055 nm, whereas, by comparison, a highly-resistive layer deposited according to the present disclosure may yield a root mean square roughness measure of $R_q$=0.055 nm and an average roughness measure of $R_a$=0.044 nm. In some embodiments, a highly-resistive material layer formed by the techniques herein may have a resistivity between 1-100 milliohm-cm.

In some embodiments, the stress and/or resistivity in the film may be altered by adding a voltage bias to the substrate. For example, the residual stress of a carbon-based highly-resistive material layer (and hence the total stack stress) can be modified by varying the bias applied on the layer either on the entire carbon stack or only on a portion of the layer (e.g., to prevent damage to the SD region). Additionally, in certain embodiments, the highly-resistive material layer may be annealed to vary or tune the resistivity of the layer without affecting the stress or roughness of the layer significantly.

Applying the techniques herein to certain of the highly-resistive material layers 606, 610, 618 may allow for one or more particular advantages over previous deposition techniques. For instance, by applying the low temperature deposition technique to the highly-resistive material layer 606, the threshold voltage variance (Vt sigma) of the SD region 608 may be improved. By applying the low temperature deposition technique to the highly-resistive material layer 610, the composition retention of the PM and/or SD regions may be improved, and cross-contamination between the regions may be improved (as described above). In addition, with the smoother layer 610, the ohmic contact layer 612 may have less discontinuity, and therefore may provide a better etch front for patterning the stacks of memory cells (e.g., the stacks as shown in FIG. 6). By applying the low temperature deposition technique to the highly-resistive material layer 618, the layer may have less discontinuity, and therefore may provide a better etch front for patterning the stacks of memory cells.

Further, as another example, embodiments herein may potentially improve structural yield, e.g., by providing a more uniform etch front, and helping to produce a smoother contact layer for the etch front. As another example, embodiments herein may help decrease or eliminate cross-contamination between the constituent elements of the PM and SD regions of memory cells, which can improve the threshold voltage of the memory cell and also provide better threshold voltage retention with cycling. As yet another example, the smoother layer can result in better speed of the memory device and lower currents in the memory cell stack. As yet another example, the resistivity of the highly-resistive material layer may increase significantly with the lower temperature deposition technique described herein, allowing for a thinner layer, which in turn may reduce the stack integrity at smaller critical dimensions by lowering the aspect ratio.

Figure 7:
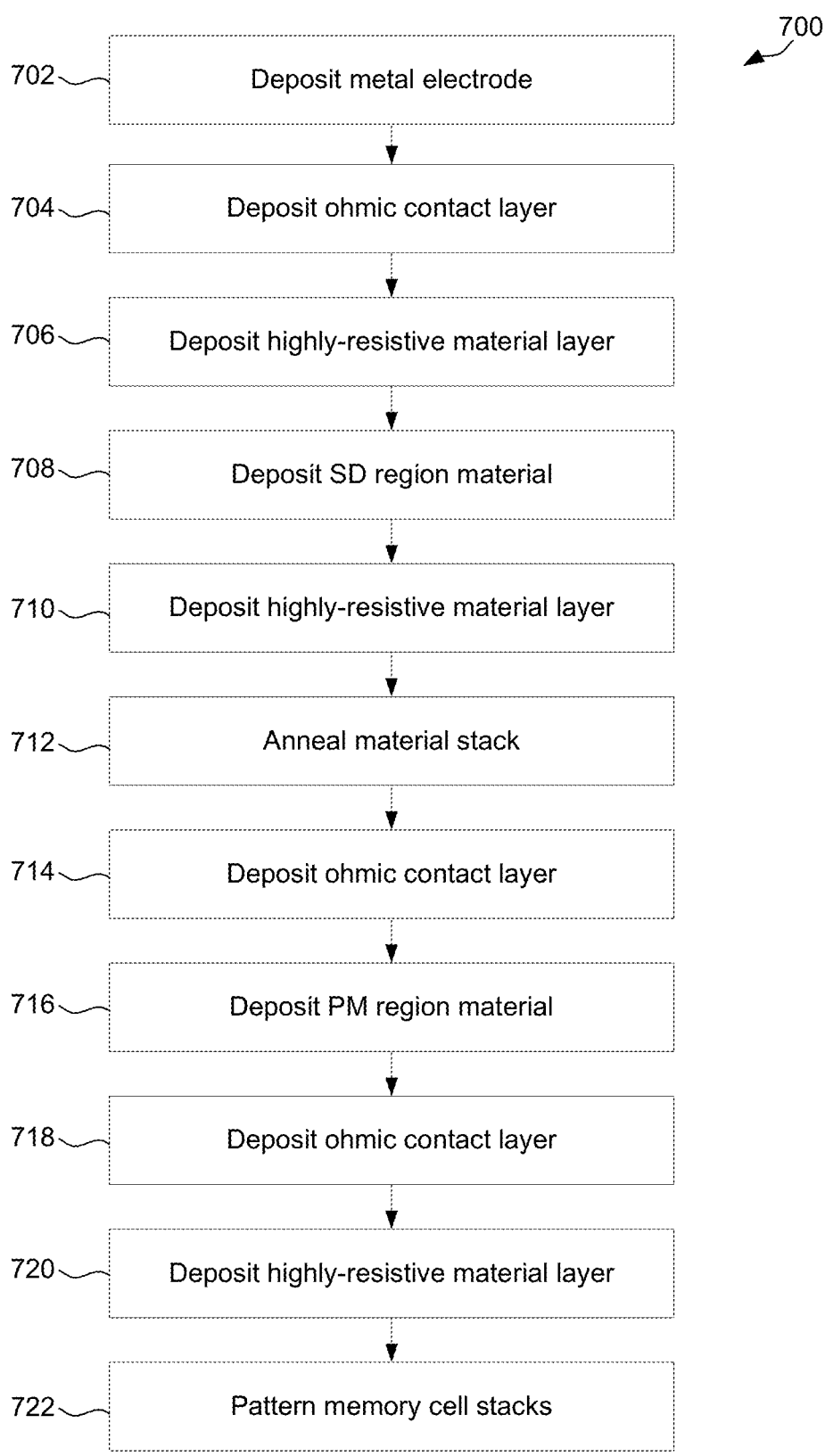
FIG. 7 is a flow diagram of an example process of fabricating memory cells in accordance with embodiments herein.

FIG. 7 is a flow diagram of an example process 700 of fabricating memory cells in accordance with embodiments herein. The example process 700 may include additional, fewer, or different operations than those shown, and the operations of the process 700 may be performed in the order shown or in another order. In some cases, one or more of the operations shown in FIG. 7 are implemented as processes that include multiple operations, sub-processes, or other types of routines. In some cases, operations can be combined, performed in another order, performed in parallel, iterated, or otherwise repeated or performed another manner.

At 702, a metal electrode (e.g., 602) is deposited on a substrate. The substrate may be a pre-processed silicon substrate (e.g., 522). In some cases, the substrate may be one underlying a CMOS or similar device and/or part of other memory stacks. The metal electrode may be formed from or include Tungsten, in certain embodiments. At 704, an ohmic layer (e.g., 604) is deposited on the metal electrode. The ohmic layer may be formed from a material that includes Tungsten, such as Tungsten Silicon Nitride (WSiN).

Figure 8B:
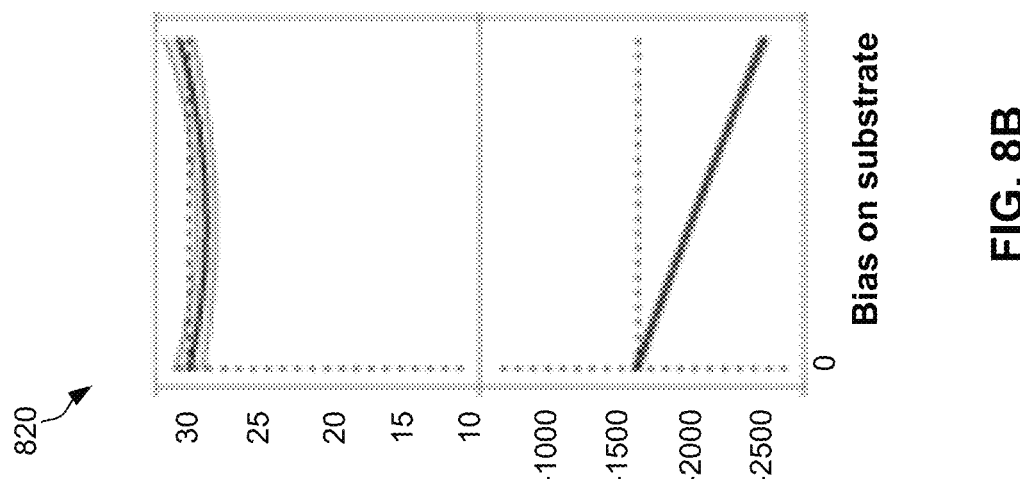
FIGS. 8A-8B illustrates example simulation results showing the effects of temperature and substrate bias voltage, respectively, on stress and resistivity of a highly-resistive material layer of a memory cell.
Figure 8A:
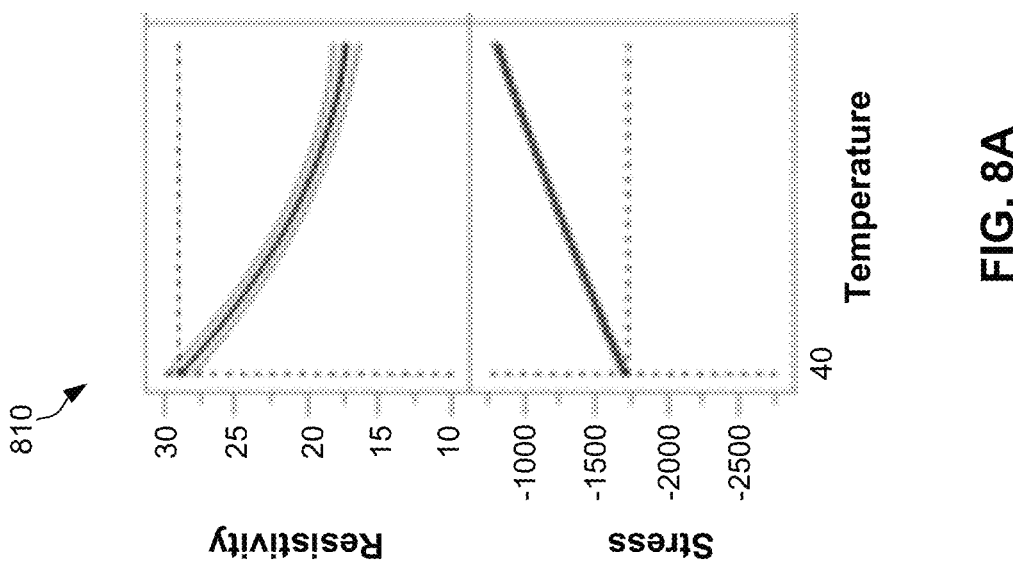

At 706, a highly-resistive material layer is deposited on the ohmic layer. The highly-resistive material layer may include Carbon, Carbon Nitride, or a combination thereof. In some embodiments, the highly-resistive material layer may be deposited using a vapor deposition technique (e.g., PVD, CVD, ALD, etc.) at a temperature below 40° C., e.g., between 20-40° C., which may provide a smoother, more dense layer as described above. In some embodiments, a bias voltage may be applied to the substrate during the deposition of the highly-resistive material layer, which may allow for tuning of the stress and/or resistivity of the highly-resistive material layer (e.g., as shown in FIGS. 8A-8B). In some embodiments, highly-resistive material layer may be further smoothed after deposition, e.g., by physical or chemical means (e.g., etching). The highly-resistive material layer may have a resistivity between 1-100 milliohm-cm in some embodiments.

At 708, an SD region material is deposited on the highly-resistive material layer. The SD region material may include a material, such as a chalcogenide material, that exhibits phase changing characteristics based on applied voltages or currents.

At 710, a highly-resistive material layer is deposited on the SD region material. The highly-resistive material layer may include Carbon, Carbon Nitride, or a combination thereof. In some embodiments, the highly-resistive material layer may be deposited using a vapor deposition technique (e.g., PVD, CVD, ALD, etc.) at a temperature below 40° C., e.g., between 20-40° C., which may provide a smoother, more dense layer as described above. In some embodiments, a bias voltage may be applied to the substrate during the deposition of the highly-resistive material layer, which may allow for tuning of the stress and/or resistivity of the highly-resistive material layer (e.g., as shown in FIGS. 8A-8B). In some embodiments, the highly-resistive material layer may be further smoothed after deposition, e.g., by physical or chemical means (e.g., etching). The highly-resistive material layer may have a resistivity between 1-100 milliohm-cm in some embodiments. At 712, the stack is annealed (e.g., heated up to approximately 100° C.), which may allow the resistivity of the layer to be tuned without affecting the stress or roughness of the layer significantly.

At 714, an ohmic contact layer is deposited on the highly-resistive material layer. The ohmic contact layer may include Tungsten in certain embodiments. Because of the low temperature deposition of the highly-resistive layer at 710, the ohmic contact layer may also have a smoother overall profile, providing one or more potential benefits as described above.

At 716, a PM region material is deposited on the highly-resistive material layer. The PM region material may include a material, such as a chalcogenide material (which may be different from the SD region chalcogenide material), that exhibits phase changing characteristics based on applied voltages or currents. At 718, another ohmic contact layer is deposited on the PM region material. The ohmic contact layer may include Tungsten in certain embodiments.

At 720, another highly-resistive material layer is deposited on the ohmic contact layer. The highly-resistive material layer may include Carbon, Carbon Nitride, or a combination thereof. In some embodiments, the highly-resistive material layer may be deposited using a vapor deposition technique (e.g., PVD, CVD, ALD, etc.) at a temperature below 40° C., e.g., between 20-40° C., which may provide a smoother, more dense layer as described above. In some embodiments, a bias voltage may be applied to the substrate during the deposition of the highly-resistive material layer, which may allow for tuning of the stress and/or resistivity of the highly-resistive material layer (e.g., as shown in FIGS. 8A-8B). In some embodiments, the highly-resistive material layer may be further smoothed after deposition, e.g., by physical or chemical means (e.g., etching). The highly-resistive material layer may have a resistivity between 1-100 milliohm-cm in some embodiments.

At 722, the layer stack is patterned to form memory cell stacks, such as those shown in FIG. 5. The patterning may be performed using photolithography techniques, e.g., by depositing a photoresistive hardmask film on top of the top resistive layer, photopatterning, and etching, or by other patterning techniques.

FIGS. 8A-8B illustrates example simulation results showing the effects of temperature and substrate bias voltage, respectively, on stress and resistivity of a highly-resistive material layer of a memory cell. As shown in the chart 810 of FIG. 8A, after deposition of the highly-resistive material layer of the stack, an increase in the temperature may cause the layer to have slightly lower resistivity, but much higher stress characteristics. Further, the chart 820 of FIG. 8B illustrates that application of a bias voltage to the substrate during the deposition of the highly-resistive layer can cause a reduction in the stress characteristics of the layer with relatively little change in the resistivity of the layer. Thus, embodiments herein may anneal the layer after deposition and/or apply a bias voltage to the substrate during deposition in order to tune the stress characteristics of the layer to desired parameters.

Use of the phrase 'to' or 'configured to,' in one embodiment, refers to arranging, putting together, manufacturing, offering to sell, importing, and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware, or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. The machine-readable storage medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage medium used in the transmission of information over the Internet via electrical, optical, acoustical or other forms of propagated signals (e.g., carrier waves, infrared signals, digital signals, etc.). Accordingly, the computer-readable medium includes any type of tangible machine-readable storage medium suitable for storing or transmitting electronic instructions or information in a form readable by a machine (e.g., a computer).

Some examples of embodiments are provided below.

Example 1 includes a method of manufacturing a crosspoint memory device, comprising: forming a material stack, wherein forming the material stack comprises: depositing a select device (SD) region material comprising chalcogenide; depositing a layer comprising carbon on the SD region material at a temperature below 40° C.; depositing an ohmic contact layer on the layer comprising carbon; and depositing a phase change material (PM) region material comprising chalcogenide on the ohmic contact layer; and patterning the material stack to form a plurality of memory cells of the cross point memory device.

Example 2 includes the subject matter of Example 1, wherein the layer comprising carbon includes carbon nitride.

Example 3 includes the subject matter of Example 1 or 2, wherein the layer comprising carbon is deposited using vapor deposition.

Example 4 includes the subject matter of Example 3, wherein the vapor deposition includes physical vapor deposition (PVD).

Example 5 includes the subject matter of Example 1, wherein the layer comprising carbon is deposited at a temperature between 20° C.-40° C.

Example 6 includes the subject matter of Example 1, wherein forming the material stack further comprises etching the layer comprising carbon before depositing the ohmic contact layer.

Example 7 includes the subject matter of any one of Examples 1-6, wherein forming the material stack further comprises applying a bias voltage to a substrate of the material stack while depositing the layer comprising carbon.

Example 8 includes the subject matter of any one of Examples 1-7, forming the material stack further comprises annealing the material stack after depositing the layer comprising carbon.

Example 9 includes the subject matter of Example 8, wherein annealing the stack comprises heating the material stack after depositing the layer comprising carbon.

Example 10 includes the subject matter of any one of Examples 1-9, wherein the layer comprising carbon is a second layer comprising carbon and forming the material stack further comprises depositing a first layer comprising carbon at a temperature below 40° C. before depositing the SD region material.

Example 11 includes the subject matter of Example 10, wherein the layer comprising carbon includes carbon nitride.

Example 12 includes the subject matter of Example 10 or 11, wherein the layer comprising carbon is deposited using vapor deposition.

Example 13 includes the subject matter of any one of Examples 1-12, wherein the layer comprising carbon is a first layer comprising carbon and forming the material stack further comprises depositing a second layer comprising carbon at a temperature below 40° C. after depositing the PM region material.

Example 14 includes the subject matter of Example 13, wherein the layer comprising carbon includes carbon nitride.

Example 15 includes the subject matter of Example 13 or 14, wherein the layer comprising carbon is deposited using vapor deposition.

Example 16 is a crosspoint memory device formed by the process of any one of Examples 1-15.

Example 17 is a non-volatile memory apparatus comprising: a plurality of memory cells, each memory cell comprising: a phase change material (PM) region; a select device (SD) region in series with the PM region; and a resistive layer between the PM region and the SD region; and an ohmic contact layer on the resistive layer; wherein the resistive layer has a measure of roughness that is less than 3% of a thickness of the resistive layer.

Example 18 includes the subject matter of Example 17, wherein the resistivity of the resistive layer is between 1-100 milliohm-cm.

Example 19 includes a storage device comprising controller circuitry and the memory apparatus of Example 17.

Example 20 includes a system comprising: a processor; and a storage device coupled to the processor, the storage device according to Example 19.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific example embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplary language does not necessarily refer to the same embodiment or the same example, but may refer to different and distinct embodiments, as well as potentially the same embodiment.

What is claimed is:

1. A method of manufacturing a crosspoint memory device, comprising:
   forming a material stack, wherein forming the material stack comprises:
      depositing a select device (SD) region material comprising chalcogenide;
      depositing a layer comprising carbon on the SD region material at a temperature below 40° C.;
      depositing an ohmic contact layer on the layer comprising carbon; and
      depositing a phase change material (PM) region material comprising chalcogenide on the ohmic contact layer; and
   patterning the material stack to form a plurality of memory cells of the crosspoint memory device.

2. The method of claim 1, wherein the layer comprising carbon includes carbon nitride.

3. The method of claim 1, wherein the layer comprising carbon is deposited using vapor deposition.

4. The method of claim 3, wherein the vapor deposition includes physical vapor deposition (PVD).

5. The method of claim 1, wherein the layer comprising carbon is deposited at a temperature between 20° C.-40° C.

6. The method of claim 1, wherein forming the material stack further comprises etching the layer comprising carbon before depositing the ohmic contact layer.

7. The method of claim 1, wherein forming the material stack further comprises applying a bias voltage to a substrate of the material stack while depositing the layer comprising carbon.

8. The method of claim 1, forming the material stack further comprises annealing the material stack after depositing the layer comprising carbon.

9. The method of claim 8, wherein annealing the stack comprises heating the material stack after depositing the layer comprising carbon.

10. The method of claim 1, wherein the layer comprising carbon is a second layer comprising carbon and forming the material stack further comprises depositing a first layer comprising carbon at a temperature below 40° C. before depositing the SD region material.

11. The method of claim 10, wherein the layer comprising carbon includes carbon nitride.

12. The method of claim 10, wherein the layer comprising carbon is deposited using vapor deposition.

13. The method of claim 1, wherein the layer comprising carbon is a first layer comprising carbon and forming the material stack further comprises depositing a second layer comprising carbon at a temperature below 40° C. after depositing the PM region material.

14. The method of claim 13, wherein the layer comprising carbon includes carbon nitride.

15. The method of claim 13, wherein the layer comprising carbon is deposited using vapor deposition.

16. A crosspoint memory device formed by a process comprising:

forming a material stack, wherein forming the material stack comprises:

depositing a select device (SD) region material comprising chalcogenide;

depositing a layer comprising carbon on the SD region material at a temperature below 40° C.;

depositing an ohmic contact layer on the layer comprising carbon; and depositing a phase change material (PM) region material comprising chalcogenide on the ohmic contact layer; and patterning the material stack to form a plurality of memory cells of the crosspoint memory device.

17. The crosspoint memory device of claim 16, wherein the layer comprising carbon includes carbon nitride.

18. The crosspoint memory device of claim 16, wherein the layer comprising carbon is deposited using vapor deposition.

19. The crosspoint memory device of claim 18, wherein the vapor deposition includes physical vapor deposition (PVD).

20. The crosspoint memory device of claim 16, wherein forming the material stack further comprises applying a bias voltage to a substrate of the material stack while depositing the layer comprising carbon.

21. The crosspoint memory device of claim 16, forming the material stack further comprises annealing the material stack after depositing the layer comprising carbon.

22. The crosspoint memory device of claim 21, wherein annealing the stack comprises heating the material stack after depositing the layer comprising carbon.

23. A method of manufacturing a crosspoint memory device, comprising:

forming a material stack, wherein forming the material stack comprises:

depositing a select device (SD) region material comprising chalcogenide;

depositing a carbon nitride layer on the SD region material at a temperature below 40° C.;

etching the carbon nitride layer;

depositing an ohmic contact layer on the carbon nitride layer; and depositing a phase change material (PM) region material comprising chalcogenide on the ohmic contact layer; and patterning the material stack to form a plurality of memory cells of the crosspoint memory device.

24. The method of claim 23, wherein the carbon nitride layer is deposited at a temperature between 20° C.-40° C.

25. The method of claim 23, further comprising applying a bias voltage to a substrate of the material stack while depositing the carbon nitride layer.

* * * * *